United States Patent
Cho et al.

(10) Patent No.: US 9,076,510 B2
(45) Date of Patent: Jul. 7, 2015

(54) POWER MIXING CIRCUIT AND SEMICONDUCTOR MEMORY DEVICE INCLUDING THE SAME

(75) Inventors: Young-Chul Cho, Hwaseong-si (KR); Young-Jin Jeon, Hwaseong-si (KR); Yong-Cheol Bae, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 504 days.

(21) Appl. No.: 13/619,793

(22) Filed: Sep. 14, 2012

(65) Prior Publication Data

US 2013/0201765 A1  Aug. 8, 2013

Related U.S. Application Data

(60) Provisional application No. 61/593,949, filed on Feb. 2, 2012.

(30) Foreign Application Priority Data

May 9, 2012  (KR) .................. 10-2012-0049067

(51) Int. Cl.
*G11C 5/14* (2006.01)
*G11C 7/02* (2006.01)
*G11C 7/10* (2006.01)
*G11C 7/20* (2006.01)
*G11C 5/04* (2006.01)

(52) U.S. Cl.
CPC  *G11C 5/147* (2013.01); *G11C 7/02* (2013.01); *G11C 7/1012* (2013.01); *G11C 7/1057* (2013.01); *G11C 7/20* (2013.01); *G11C 5/04* (2013.01); *G11C 5/148* (2013.01)

(58) Field of Classification Search
USPC ...................... 365/226, 227, 189.17
See application file for complete search history.

(56) References Cited

U.S. PATENT DOCUMENTS

| 5,943,527 A | 8/1999 | Kashiwagi et al. |
| 6,418,075 B2 | 7/2002 | Shimano et al. |
| 6,504,353 B2 | 1/2003 | Kobayashi et al. |
| 6,885,605 B2 | 4/2005 | Lee et al. |
| 7,190,206 B2 | 3/2007 | Lee et al. |
| 2003/0107414 A1* | 6/2003 | Cho ............................. 327/108 |
| 2005/0201178 A1* | 9/2005 | Ho et al. ....................... 365/226 |

FOREIGN PATENT DOCUMENTS

KR      100585113      5/2006

* cited by examiner

Primary Examiner — Vu Le
(74) Attorney, Agent, or Firm — Muir Patent Law, PLLC

(57) ABSTRACT

A power mixing circuit capable of maintaining a stable output voltage in a deep-power-down mode is provided. The power mixing circuit includes an input buffer, a power mixing control circuit, a power mixing driver and an output buffer. The input buffer is configured to operate using a first supply voltage, and to generate a first voltage signal in response to an input signal. The power mixing control circuit is configured to generate a power mixing control signal based on a power-up signal and a deep-power-down mode signal. The power mixing driver is configured to operate using an external supply voltage and a second supply voltage, to perform power mixing on the external supply voltage and the second supply voltage, and to generate a second voltage signal. The output buffer is configured to operate using the second supply voltage, and to generate an output signal.

20 Claims, 11 Drawing Sheets

POWER MIXING CIRCUIT AND SEMICONDUCTOR MEMORY DEVICE INCLUDING THE SAME

CROSS-REFERENCE TO RELATED APPLICATION

This application claims the benefit of provisional U.S. Application No. 61/593,949 filed on Feb. 2, 2012, and also claims priority under 35 U.S.C. §119 to Korean Patent Application No. 10-2012-0049067 filed on May 9, 2012, the entire contents of each of which are incorporated herein by reference in their entirety.

BACKGROUND

Example embodiments relate to a semiconductor memory device, and particularly to a semiconductor memory device including a power mixing circuit.

In a semiconductor memory device, an external supply voltage, a supply voltage used in an output driving circuit, and a supply voltage used in internal circuit blocks except for the output driving circuit are used. The semiconductor memory device may include a power mixing circuit to prevent data transmission errors between circuit blocks using different supply voltages.

As the electronic industry develops, a semiconductor memory device used in electronic devices is often required to consume less power. In particular, the semiconductor memory device used in a mobile device such as a hand phone has a power-down mode or a deep-power-down mode (hereinafter referred to a deep-power-down mode) to reduce power consumption. An internal supply voltage of the semiconductor memory devices included in the mobile device in the deep-power-down mode may be turned off not to operate a part of the circuits.

The semiconductor memory device having the power mixing circuit may exhibit an unstable voltage of an output node of the semiconductor memory device in the deep-power-down mode.

SUMMARY

Embodiments of the disclosure provide a power mixing circuit capable of maintaining a stable voltage level at an output node in a deep-power-down mode.

Embodiments of the disclosure also provide a semiconductor memory device including the power mixing circuit.

The technical objectives of the disclosure are not limited to the above disclosure; other objectives may become apparent to those of ordinary skill in the art based on the following descriptions.

In accordance with an embodiment, a power mixing circuit includes an input buffer, a power mixing control circuit, a power mixing driver and an output buffer.

The input buffer is configured to operate using a first supply voltage, and to generate a first voltage signal in response to an input signal. The power mixing control circuit is configured to generate a power mixing control signal based on a power-up signal and a deep-power-down mode signal. The power mixing driver is configured to operate using an external supply voltage and a second supply voltage, to perform power mixing on the first voltage signal, and to generate a second voltage signal in response to the power mixing control signal. The output buffer is configured to operate using the second supply voltage, and to generate an output signal in response to the second voltage signal.

In accordance with another embodiment, a semiconductor memory device includes a memory cell array configured to operate in response to a word line enable signal and a column selecting signal, an address input buffer, a row decoder, a column decoder, an input/output (I/O) sense amplifier, a power-up signal generating circuit and an output circuit.

The address input buffer is configured to generate a row address signal and a column address signal based on an external address. The row decoder is configured to decode the row address signal to generate the word line enable signal. The column decoder is configured to decode the column address signal, and to generate the column selecting signal. The I/O sense amplifier is configured to amplify data output from the memory cell array, to generate first data, and to transfer data received from an exterior to the memory cell array. The power-up signal generating circuit is configured to generate a power-up signal based on an external supply voltage. The output circuit is configured to perform power mixing on an output signal of the I/O sense amplifier based on a deep-power-down mode signal, the power-up signal and the external supply voltage, and to generate output data. The semiconductor memory device is configured to generate a power mixing control signal based on the deep-power-down mode signal and the power-up signal in a deep-power-down mode, and to generate a stable output voltage in response to the power mixing control signal regardless of a level of an internal supply voltage.

In accordance with further embodiment, a semiconductor device includes a terminal for receiving an external supply voltage, an internal voltage generation circuit, an input circuit, power mixing control circuit, a power mixing driver, and output circuit.

The internal voltage generation circuit is configured to generate a first supply voltage based on the external supply voltage. The input circuit is configured to receive the first supply voltage and an input signal. The power mixing control circuit is configured to receive the external supply voltage and configured to generate a power mixing control signal in response to a power-up signal and a deep-power-down mode signal. The power-up signal is generated when the external power supply voltage rises up and the deep-power-down mode signal is generated when the semiconductor device operates in a deep-power-down mode. The power mixing driver is configured to receive the external power supply voltage and a second supply voltage and configured to generate a power mixing driver output signal in response to the power mixing control signal and an output signal of the input circuit. The output circuit is configured to output a power mixing circuit output signal in response to the power mixing driver output signal. The power mixing circuit output signal has a logic low level or a logic high level regardless of a level of the first supply voltage when the semiconductor device operates in a power down mode.

Therefore, the power mixing circuit according to embodiments of the disclosure may stabilize a voltage of an output node in a deep-power-down mode. Accordingly, a semiconductor memory device including the power mixing circuit according to embodiments may be insensitive to noise and have little data transmission error.

BRIEF DESCRIPTION OF THE DRAWINGS

Various example embodiments will be described below in more detail with reference to the accompanying drawings.

DETAILED DESCRIPTION OF THE EMBODIMENTS

Figure 1:
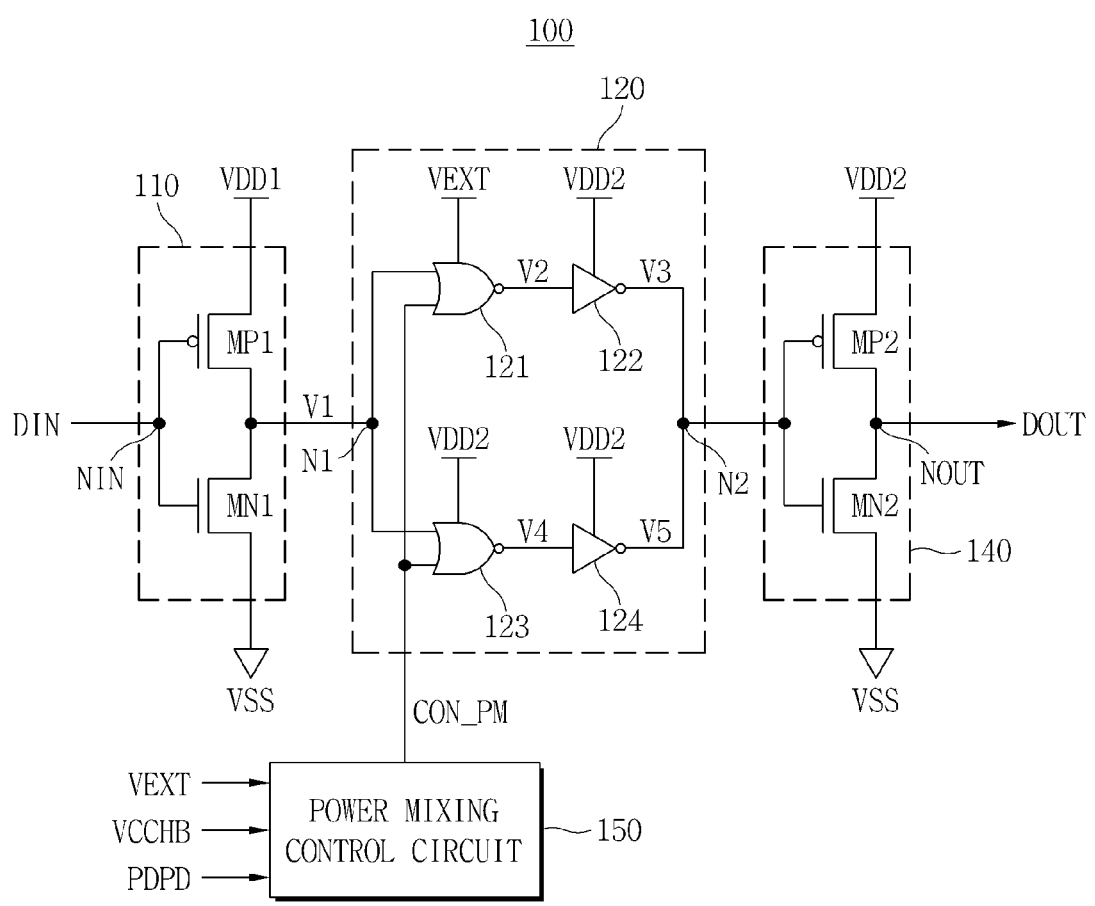
FIG. 1 is a circuit diagram of a power mixing circuit in accordance with an embodiment.

Various embodiments will now be described more fully with reference to the accompanying drawings in which some example embodiments are shown. These present disclosure may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to three-dimensional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle may have rounded or curved features at its edges rather than a sharp angle. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a power mixing circuit 100 in accordance with an embodiment.

Referring to FIG. 1, the power mixing circuit 100 may include an input buffer 110, a power mixing driver 120, an output buffer 140 and a power mixing control circuit 150.

The input buffer 110 operates using a first supply voltage VDD1, and receives an input signal DIN from an input node NIN. The first supply voltage VDD1 may be generated based on an external supply voltage VEXT and have a voltage level equal to or greater than a level of the external supply voltage VEXT. The input buffer 100 buffers the input signal DIN to generate a first voltage signal V1, and outputs the first voltage signal V1 to a first node N1. The power mixing control circuit 150 generates a power mixing control signal CON_PM based on a power-up signal VCCHB and a deep-power-down mode signal PDPD. The power-up signal may be generated when the external supply voltage VEXT rises up, and the deep-power-down mode signal may be generated when a semiconductor device operates in a deep-power-down mode. The power mixing control circuit 150 may operate using the external supply voltage VEXT.

The power mixing driver 120 operates using the external supply voltage VEXT and a second supply voltage VDD2, and receives the first voltage signal V1 from the first node N1. The second supply voltage VDD2 may be input from the exterior and have a level equal to or less than the external supply voltage VEXT. The power mixing driver 120 performs power mixing on the first voltage signal V1 in response to the power mixing control signal CON_PM to generate a second voltage signal, and outputs the second voltage signal to a second node N2. The output buffer 140 operates using the second supply voltage VDD2, and receives the second voltage signal from the second node N2. The output buffer 140 buffers the second voltage signal to generate an output signal DOUT, and outputs the output signal DOUT to an output node NOUT.

The input buffer 110 may include a PMOS transistor MP1 and an NMOS transistor MN1. The PMOS transistor MP1 has a gate to which the input signal DIN is applied, and a source connected to the first supply voltage VDD1. The NMOS transistor MN1 has a gate to which the input signal DIN is applied, a source connected to a ground VSS and a drain connected to a drain of the PMOS transistor MP1.

The power mixing driver 120 may include a first NOR circuit 121, a first inverter 122, a second NOR circuit 123 and a second inverter 124.

The first NOR circuit 121 operates using the external supply voltage VEXT, and performs a logical NOR operation on the power mixing control signal CON_PM and the first voltage signal V1. The first inverter 122 operates using the second supply voltage VDD2, and inverts a phase of an output signal V2 of the first NOR circuit 121. The second NOR circuit 123 operates using the second supply voltage VDD2, and performs a logical NOR operation on the power mixing control signal CON_PM and the first voltage signal V1. The second inverter 124 operates using the second supply voltage VDD2, and inverts a phase of an output signal V4 of the second NOR circuit 123. The second voltage signal, which is a voltage signal of the second node N2, is an added signal of an output signal V3 of the first inverter 122 and an output signal V5 of the second inverter 124.

The first NOR circuit 121 is in an on state in the deep-power-down mode because the first NOR circuit 121 operates using the external supply voltage VEXT.

The output buffer 140 may include a PMOS transistor MP2 and an NMOS transistor MN2. The PMOS transistor MP2 has a gate to which a voltage signal of the second node N2 is applied, and a source connected to the second supply voltage VDD2. The NMOS transistor MN2 has a gate to which the voltage signal of the second node N2 is applied, a source connected to the ground VSS and a drain connected to a drain of the PMOS transistor MP2. The drain of the PMOS transistor MP2 and the drain of the NMOS transistor MN2 are connected at the output node NOUT, and the output signal DOUT is output at the output node NOUT.

The power mixing circuit 100 of FIG. 1 may maintain the voltage of the output node at a constant value (i.e., a logic high level or a logic low level) in response to the power mixing control signal CON_PM having a logic high state in the deep-power-down mode. In FIG. 1, when the power mixing control signal CON_PM has a logic high state, the power mixing driver 120 may maintain a voltage of the output node NOUT at a logic low state regardless of the voltage level of the first voltage signal V1 which is a voltage of the first node N1. In the conventional art, in the deep-power-down mode, a voltage of an input terminal and a voltage of an output terminal of a power mixing driver may be unstable when a first supply voltage VDD1 is off and a second supply voltage VDD2 is on. The power mixing circuit 100 in accordance with an example embodiment shown in FIG. 1 may stabilize the output voltage of the power mixing circuit 100 in the deep-power-down mode using the power mixing control signal CON_PM that is enabled in response to the power-up signal VCCHB and a deep-power-down mode signal PDPD.

Figure 2:
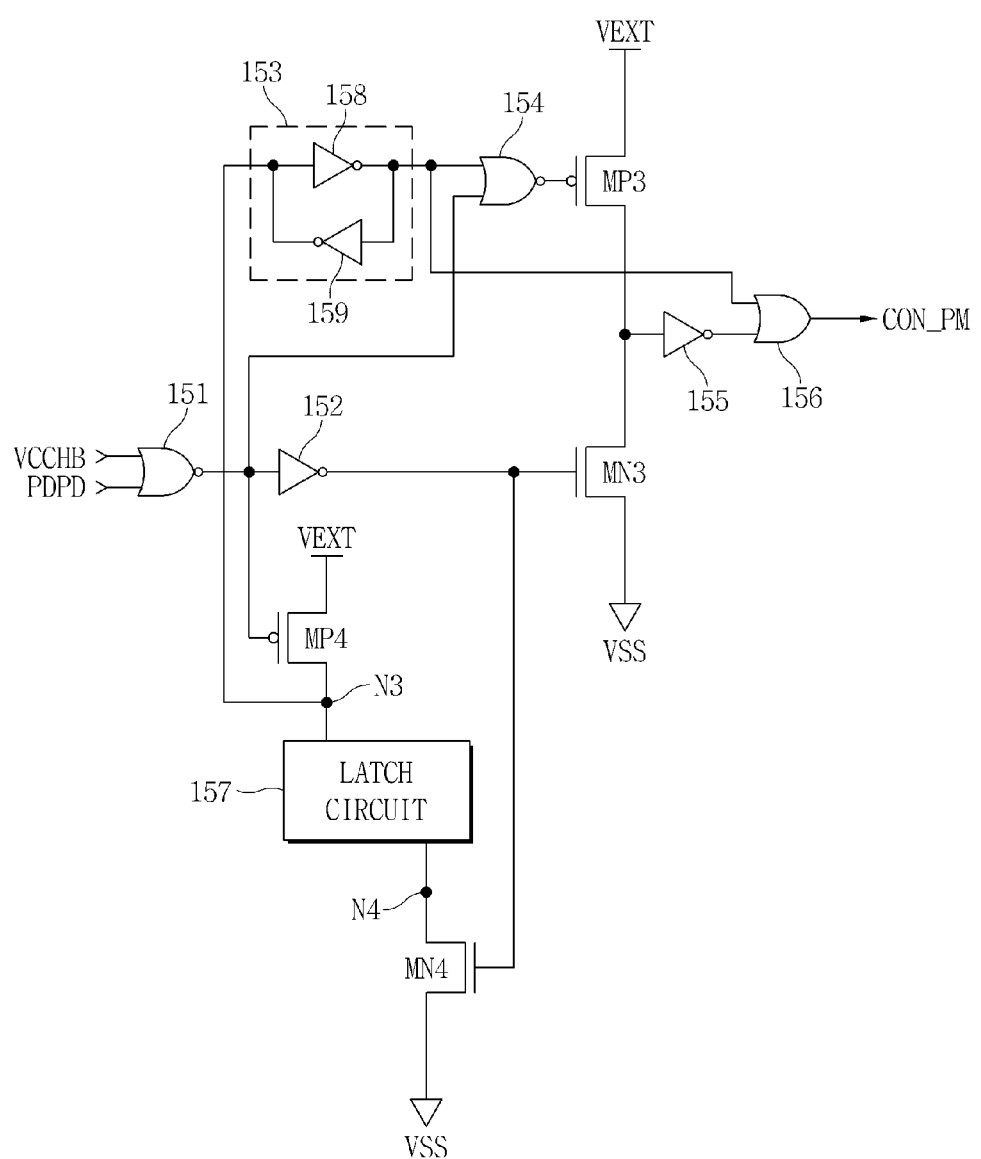
FIG. 2 is a circuit diagram illustrating a power mixing control circuit included in the power mixing circuit of FIG. 1, in accordance with an embodiment.

FIG. 2 is a circuit diagram illustrating a power mixing control circuit 150 included in the power mixing circuit 100 of FIG. 1, in accordance with an embodiment.

Referring to FIG. 2, the power mixing control circuit 150 may include a first NOR circuit 151, a first inverter 152, a first PMOS transistor MP4, a first NMOS transistor MN4, a first latch circuit 157, a second latch circuit 153, a second NOR circuit 154, a second PMOS transistor MP3, a second NMOS transistor MN3, a third inverter 155 and an OR circuit 156.

The first NOR circuit 151 performs a logical NOR operation on the power-up signal VCCHB and the deep-power-down mode signal PDPD. The first inverter 152 inverts a phase of an output signal of the first NOR circuit 151. The first PMOS transistor MP4 has a gate connected to an output terminal of the first NOR circuit 151, and a source connected to the external supply voltage VEXT. The first NMOS transistor MN4 has a gate connected to an output terminal of the first inverter 152, and a source connected to a ground VSS. The first latch circuit 157 is connected to a drain of the first PMOS transistor MP4 and a drain of the first NMOS transistor MN4. The second latch circuit 153 may include an inverter 158 and an inverter 159, latch a voltage of the drain of the first PMOS transistor MP4, and invert a phase of a voltage of the drain of the first PMOS transistor MP4. In one embodiment, the second latch circuit 153 may include only the inverter 158 without the inverter 159 because the first latch circuit 157 latches the voltage of the drain of the first PMOS transistor MP4. The second NOR circuit 154 performs a logical NOR operation on an output signal of the second latch circuit 153 and the output signal of the first NOR circuit 151. The second PMOS transistor MP3 has a gate connected to an output terminal of the second NOR circuit 154, and a source connected to the external supply voltage VEXT. The second NMOS transistor MN3 has a drain connected to a drain of the second PMOS transistor MP3, a gate connected to an output terminal of the first inverter 152, and a source connected to the ground VSS. The third inverter 155 inverts a voltage of a drain of the second NMOS transistor MN3. In one embodiment, the third inverter 155 may be replaced with a latch circuit to latch the voltage of a drain of the second NMOS transistor MN3. The OR circuit 156 performs a logical OR operation on an output signal of the second latch circuit 153 and an output signal of the third inverter 155 to generate the power mixing control signal CON_PM.

Figure 3:
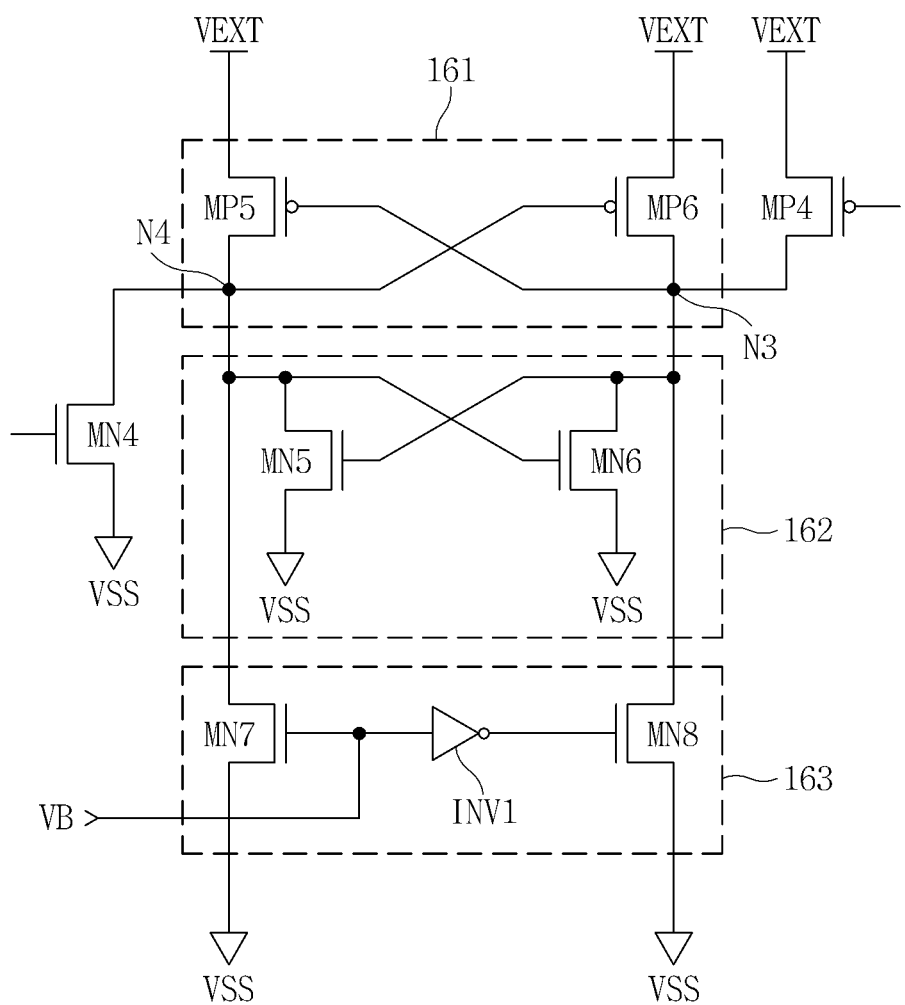
FIG. 3 is circuit diagram illustrating a latch circuit included in the power mixing control circuit of FIG. 2, in accordance with an embodiment.

FIG. 3 is circuit diagram illustrating a first latch circuit 157 included in the power mixing control circuit 150 of FIG. 2, in accordance with an embodiment.

Referring to FIG. 3, the first latch circuit 157 may include a first latch unit 161, a second latch unit 162 and a current supplying unit 163.

The first latch unit 161 is connected to the external supply voltage VEXT and may include two PMOS transistors MP5 and MP6 cross-coupled to each other. The second latch unit 162 is connected to a drain of the first PMOS transistor MP4 and a drain of the first NMOS transistor MN4, and may include two NMOS transistors MN5 and MN6 cross-coupled to each other. The current supplying unit 163 forms current paths between the drain of the first PMOS transistor MP4 and the ground, and between the drain of the first NMOS transistor MN4 and the ground. The current supplying unit 163 may include NMOS transistors MN7 and MN8 and an inverter INV1. A control signal VB is applied to a gate of the NMOS transistors MN7 and an input of the inverter INV1. The control signal VB may be generated from a controller (not shown) or an inner circuit of a semiconductor memory device.

The drain of the first PMOS transistor MP4 is connected to the node N3, and the drain of the first NMOS transistor MN4 is connected to the node N4.

Figure 4:
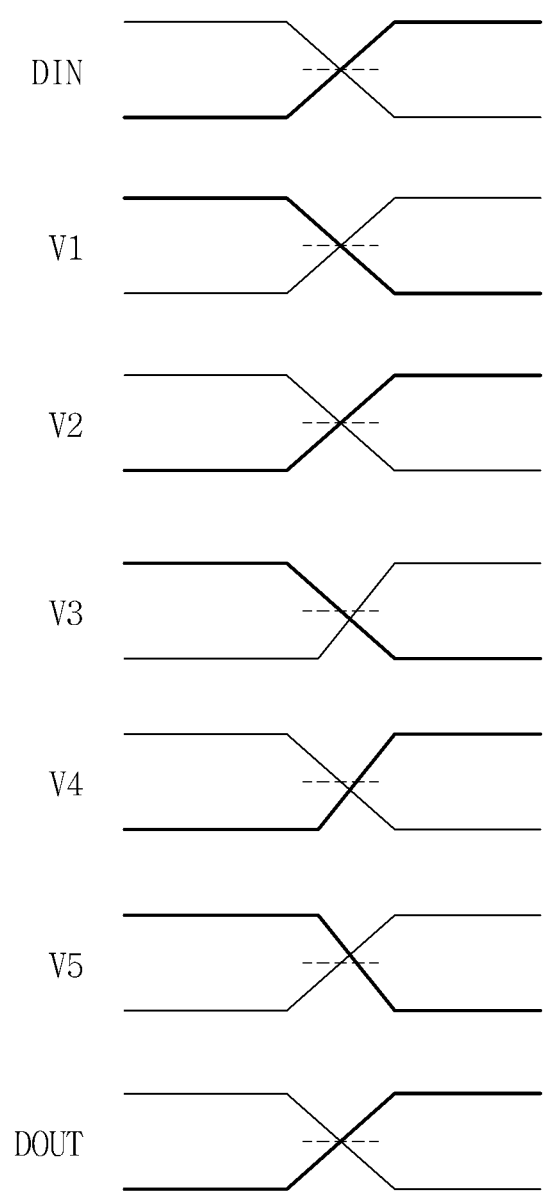
FIG. 4 is a timing diagram illustrating the operation of the power mixing circuit of FIG. 1 in a normal operating mode, in accordance with an embodiment.

FIG. 4 is a timing diagram illustrating the operation of the power mixing circuit 100 of FIG. 1 in a normal operating mode, in accordance with an embodiment. In FIG. 4, an example of power mixing when the second supply voltage VDD2 has a voltage level lower than a voltage level of the first supply voltage VDD1 is shown. In FIG. 4, the input signal DIN, the first voltage signal V1, the output voltage signal V2 of the first NOR circuit 121, the output voltage signal V3 of the first inverter 122, the output voltage signal V4 of the second NOR circuit 123, and the output voltage signal V5 of the second inverter 124 are shown. In FIG. 4, an inverted signal and non-inverted signal for each of the signals are shown, and the thick lines denote non-inverted signals and the thin lines denote inverted signals.

Referring to FIG. 1, V1 is the output voltage signal of the input buffer 110 that operates using the first supply voltage VDD1, V2 is the output voltage signal of the first NOR circuit 121 that operates using the external supply voltage VEXT, and V3 is the output voltage signal V3 of the first inverter 122 that operates using the second supply voltage VDD2. The first inverter 122 transitions early from high state to low state because the first inverter 122 operates using the second supply voltage VDD2 which is lower than the external supply voltage VEXT. The second NOR circuit 123 transitions early from high state to low state and transitions late from low state to high state because the second NOR circuit 123 operates using the second supply voltage VDD2 which is lower than the first supply voltage VDD1. The second inverter 124 operates using the second supply voltage VDD2 as the second NOR circuit 123. Therefore, V5 becomes a signal having an opposite phase of V4. The voltage signal of the second node N2, which is an output node of the power mixing driver 120, is a sum of V3 and V5. The output signal DOUT of the power mixing circuit 100 may be a voltage signal having the same shape as the input signal DIN.

Figure 5:
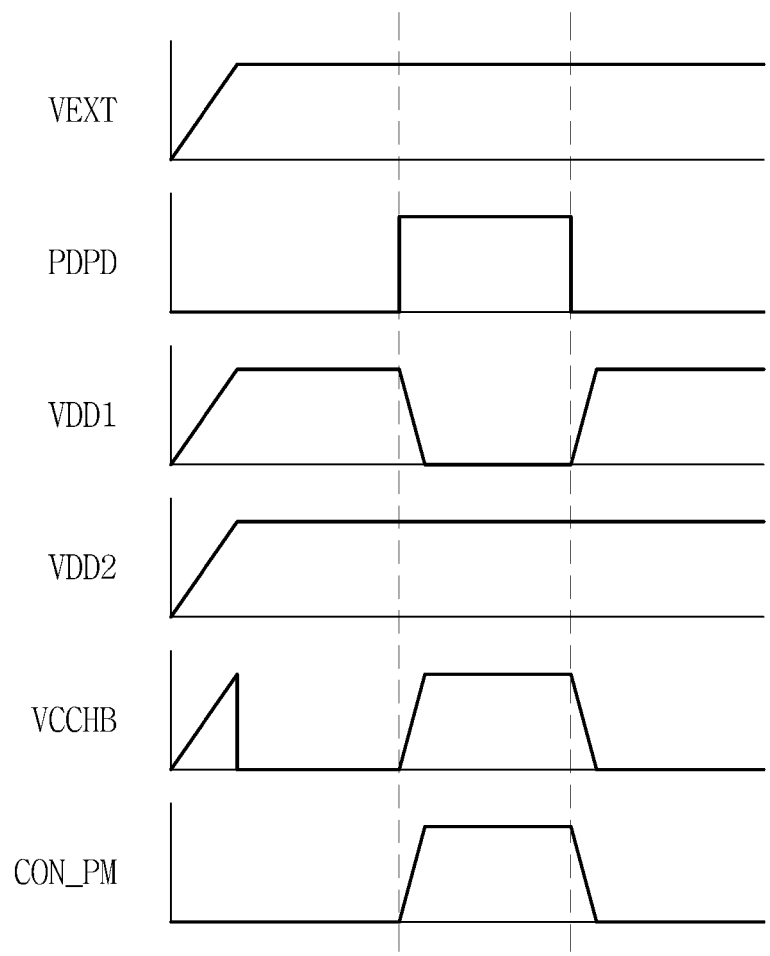
FIG. 5 is a timing diagram illustrating the operation of the power mixing circuit of FIG. 1 in a deep-power-down mode, in accordance with an embodiment.

FIG. 5 is a timing diagram illustrating the operation of the power mixing circuit 100 of FIG. 1 in a deep-power-down mode, in accordance with an embodiment. In FIG. 5, the external supply voltage VEXT, the deep-power-down mode signal PDPD, the first supply voltage VDD1, the second supply voltage VDD2, the power-up signal VCCHB and the power mixing control signal CON_PM are shown.

Referring to FIG. 5, in the deep-power-down mode, PDPD and VCCHB maintain a logic high state, and VDD1 is off and VDD2 is on.

Semiconductor memory devices used in a mobile system such as a mobile phone may have a power-down-mode or a deep-power-down mode in which certain parts of the circuits included in the semiconductor memory devices are off to reduce a current consumption. For example, in the deep-power-down mode, an internal supply voltage (VINT) supplied to a semiconductor memory device may be off and a driver supply voltage VDDQ may be on. The first supply voltage VDD1 corresponds to the VINT, and the second supply voltage VDD2 corresponds to VDDQ. A power-down mode may be a mode where one or more circuit elements of a mobile phone or other device operate at a reduced voltage (compared to a regular operation mode) or do not operate based on the application of a predetermined voltage, whereas a deep-power-down mode may be a mode where additional circuit elements compared to the power-down mode operate at a reduced voltage, or where overall, the voltage used for operation of the circuit elements is zero or is supplied to fewer circuit elements than in the power-down mode.

Figure 6:
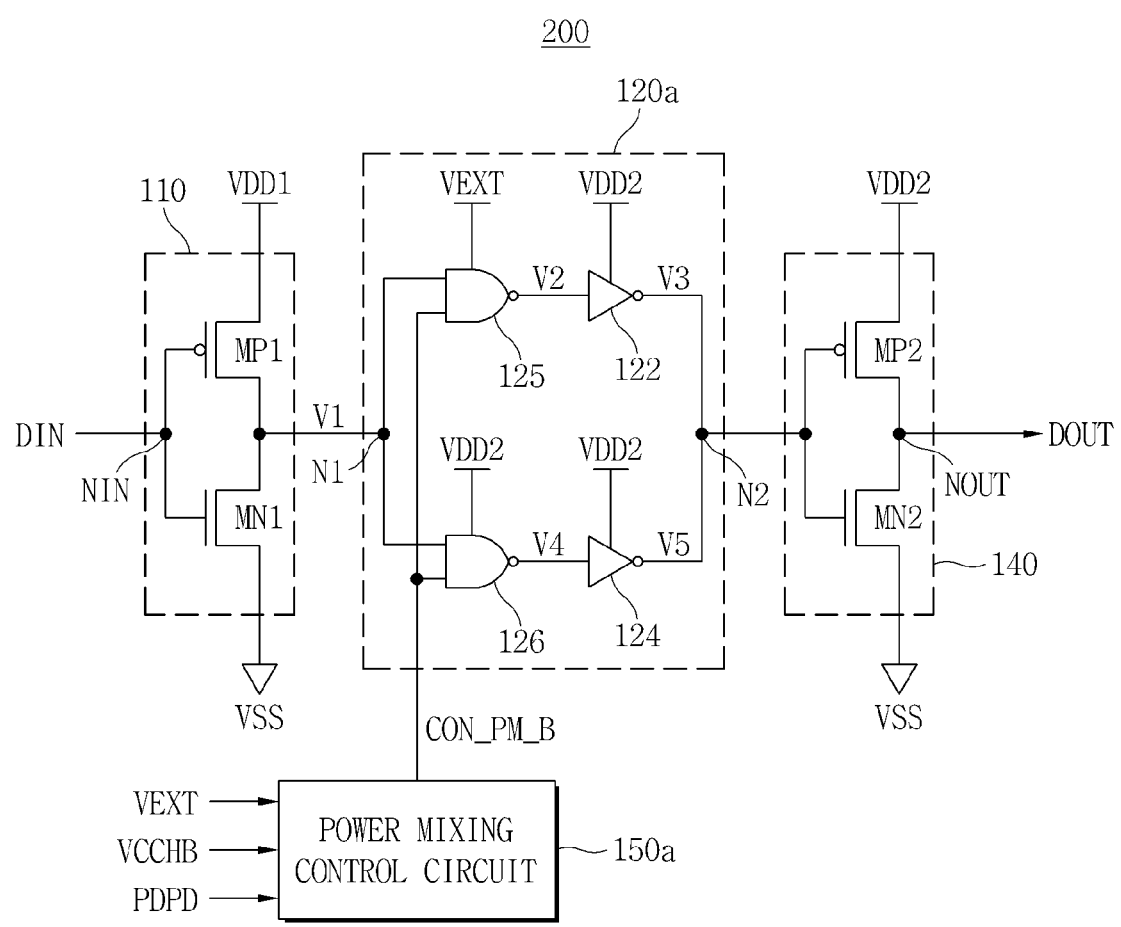
FIG. 6 is a circuit diagram of a power mixing circuit in accordance with another embodiment.

FIG. 6 is a circuit diagram of a power mixing circuit 200 in accordance with another embodiment.

Referring to FIG. 6, the power mixing circuit 200 may include an input buffer 110, a power mixing driver 120a, an output buffer 140 and a power mixing control circuit 150a.

The input buffer 110 and the output buffer 140 may have the same structure as the input buffer 110 and the output buffer 140 shown in FIG. 1.

The power mixing control circuit 150a generates an inverted power mixing control signal CON_PM_B based on a power-up signal VCCHB and a deep-power-down mode signal PDPD. The inverted power mixing control signal CON_PM_B has an opposite phase of the power mixing control signal CON_PM of the power mixing control circuit 150. The power mixing control circuit 150a may operate using an external supply voltage VEXT.

The power mixing driver 120a may include a first NAND circuit 125, a first inverter 122, a second NAND circuit 126 and a second inverter 124.

The first NAND circuit 125 operates using the external supply voltage VEXT, and performs a logical NAND operation on the inverted power mixing control signal CON_PM_B and the first voltage signal V1. The first inverter 122 operates using the second supply voltage VDD2, and inverts a phase of an output signal V2 of the first NAND circuit 125. The second NAND circuit 126 operates using the second supply voltage VDD2, and performs a logical NAND operation on the inverted power mixing control signal CON_PM_B and the first voltage signal V1. The second inverter 124 operates using the second supply voltage VDD2, and inverts a phase of an output signal V4 of the second NAND circuit 126. The second voltage signal, which is a voltage signal of the second node N2, is an added signal of an output signal V3 of the first inverter 122 and an output signal V5 of the second inverter 124. The second supply voltage VDD2 may be input from the exterior and have a level equal to or less than the external supply voltage VEXT.

The first NAND circuit 125 is in an on state in the deep-power-down mode because the first NAND circuit 125 operates using the external supply voltage VEXT.

For example, the power mixing driver 120a operates using the external supply voltage VEXT and a second supply voltage VDD2, and receives the first voltage signal V1 from the first node N1. The power mixing driver 120a performs power mixing on the first voltage signal V1 in response to the inverted power mixing control signal CON_PM_B to generate a second voltage signal, and outputs the second voltage signal to a second node N2.

The power mixing circuit 200 of FIG. 6 may maintain the voltage of the output node at a constant value (i.e., a logic high level or a logic low level) in response to the inverted power mixing control signal CON_PM_B having a logic low state in the deep-power-down mode. In FIG. 6, when the inverted power mixing control signal CON_PM_B has a logic low state, the power mixing driver 120a may maintain a voltage of the output node NOUT at a logic high state regardless of the voltage level of the first voltage signal V1 which is a voltage of the first node N1. In the conventional art, in the deep-power-down mode, a voltage of an input terminal and a voltage of an output terminal of the power mixing driver may be unstable when a first supply voltage is off and a second supply voltage is on. The power mixing circuit 200 in accordance with an example embodiment shown in FIG. 6 may stabilize the output voltage of the power mixing circuit 200 in the deep-power-down mode using the inverted power mixing control signal CON_PM_B that is enabled in response to the power-up signal VCCHB and a deep-power-down mode signal PDPD.

Figure 7:
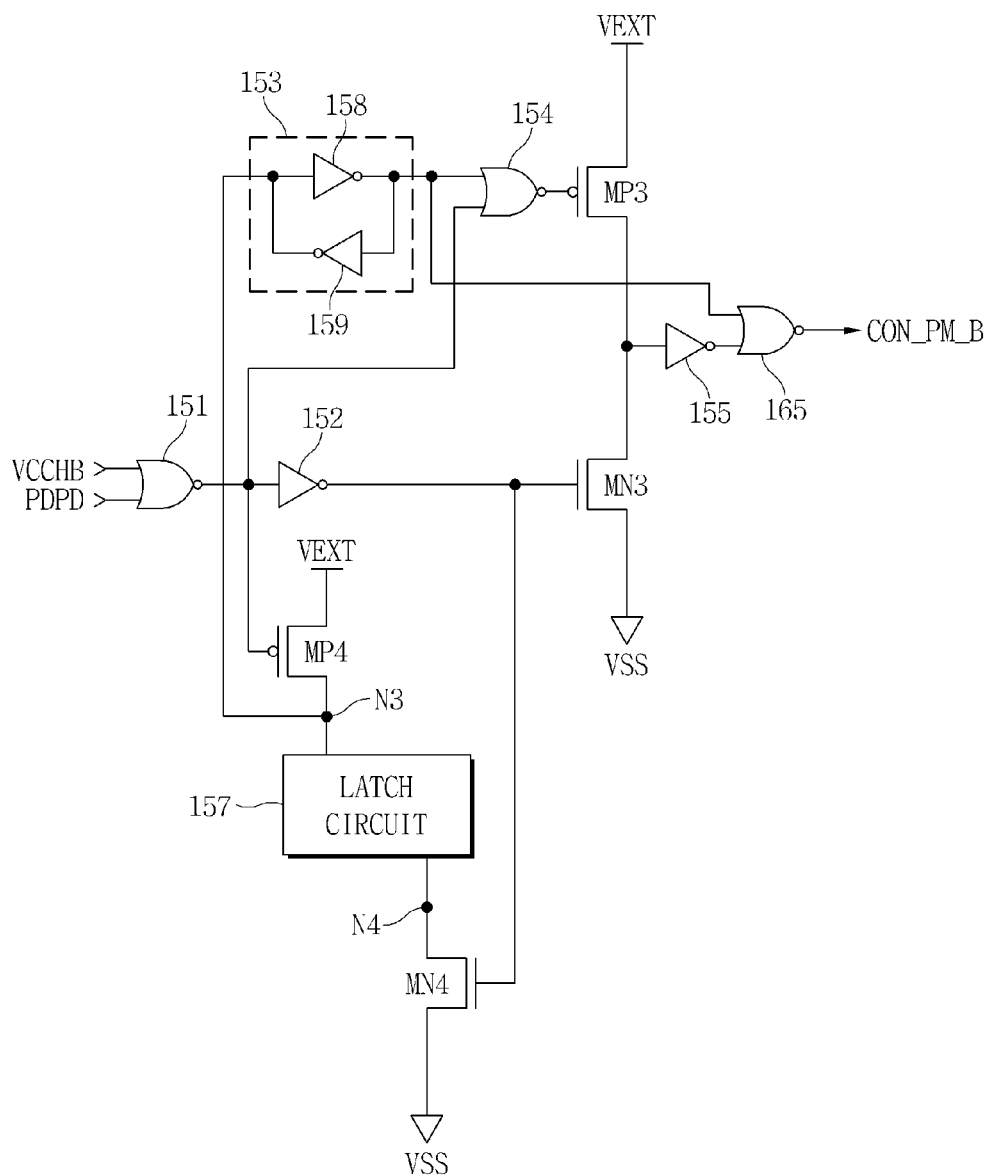
FIG. 7 is a circuit diagram illustrating a power mixing control circuit included in the power mixing circuit of FIG. 6, in accordance with an embodiment.

FIG. 7 is a circuit diagram illustrating a power mixing control circuit 150*a* included in the power mixing circuit 200 of FIG. 6, in accordance with an embodiment.

Referring to FIG. 7, the power mixing control circuit 150*a* may include a first NOR circuit 151, a first inverter 152, a first PMOS transistor MP4, a first NMOS transistor MN4, a first latch circuit 157, a second latch circuit 153, a second NOR circuit 154, a second PMOS transistor MP3, a second NMOS transistor MN3, a third inverter 155 and an NOR circuit 165.

The first NOR circuit 151 performs a logical NOR operation on the power-up signal VCCHB and the deep-power-down mode signal PDPD. The first inverter 152 inverts a phase of an output signal of the first NOR circuit 151. The first PMOS transistor MP4 has a gate connected to an output terminal of the first NOR circuit 151, and a source connected to the external supply voltage VEXT. The first NMOS transistor MN4 has a gate connected to an output terminal of the first inverter 152, and a source connected to a ground VSS. The first latch circuit 157 is connected to a drain of the first PMOS transistor MP4 and a drain of the first NMOS transistor MN4. The second latch circuit 153 may include an inverter 158 and an inverter 159, latch a voltage of the drain of the first PMOS transistor MP4, and invert a phase of a voltage of the drain of the first PMOS transistor MP4. In one embodiment, the second latch circuit 153 may include only the inverter 158 without the inverter 159 because the first latch circuit 157 latches the voltage of the drain of the first PMOS transistor MP4. The second NOR circuit 154 performs a logical NOR operation on an output signal of the second latch circuit 153 and the output signal of the first NOR circuit 151. The second PMOS transistor MP3 has a gate connected to an output terminal of the second NOR circuit 154, and a source connected to the external supply voltage VEXT. The second NMOS transistor MN3 has a drain connected to a drain of the second PMOS transistor MP3, a gate connected to an output terminal of the first inverter 152, and a source connected to the ground VSS. The third inverter 155 inverts a voltage of a drain of the second NMOS transistor MN3. In one embodiment, the third inverter 155 may be replaced with a latch circuit to latch the voltage of a drain of the second NMOS transistor MN3. The NOR circuit 165 performs a logical NOR operation on an output signal of the second latch circuit 153 and an output signal of the third inverter 155 to generate the inverted power mixing control signal CON_PM_B.

Figure 8:
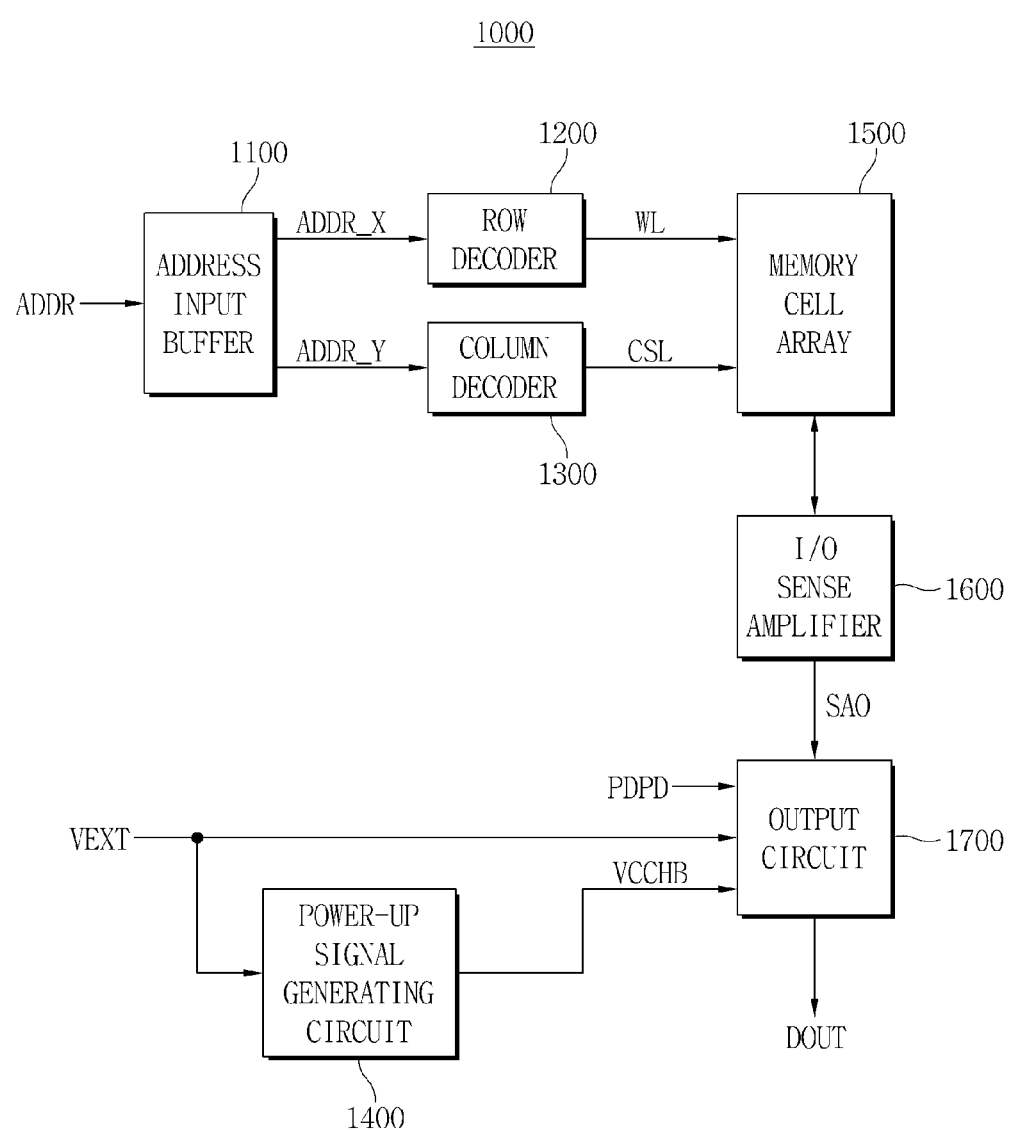
FIG. 8 is a block diagram of an example of a semiconductor memory device including the power mixing circuit in accordance with embodiments.

FIG. 8 is a block diagram of an example of a semiconductor memory device 1000 including the power mixing circuit in accordance with embodiments.

Referring to FIG. 8, the semiconductor memory device 1000 includes a memory cell array 1500 configured to operate in response to a word line enable signal and a column selecting signal, an address input buffer 1100, a row decoder 1200, a column decoder 1300, an input/output (I/O) sense amplifier 1600, a power-up signal generating circuit 1400 and an output circuit 1700.

The address input buffer 1100 generates a row address signal ADDR_X and a column address signal ADDR_Y based on an external address ADDR. The row decoder 1200 decodes the row address signal ADDR_X to generate the word line enable signal WL. The column decoder 1300 decodes the column address signal ADDR_Y to generate the column selecting signal CSL. The I/O sense amplifier 1600 amplifies data output from the memory cell array 1500 to generate first data SAO, and transfers data received from an exterior to the memory cell array 1500. The power-up signal generating circuit 1400 generates a power-up signal VCCHB based on an external supply voltage VEXT.

The output circuit 1700 may include an output driving circuit having a circuit structure of a power mixing circuit according to example embodiments of the disclosure. The output circuit 1700 performs power mixing on the first data SAO of the I/O sense amplifier 1600 based on a deep-power-down mode signal PDPD, the power-up signal VCCHB and the external supply voltage VEXT to generate output data DOUT.

The semiconductor memory device 1000 generates a power mixing control signal CON_PM based on the deep-power-down mode signal PDPD and the power-up signal VCCHB in a deep-power-down mode, and generates a stable output voltage in response to the power mixing control signal CON_PM regardless of level of an internal supply voltage. The semiconductor memory device 1000 may be, for example, a semiconductor chip, a semiconductor package having one or more semiconductor chips, a stack of semiconductor packages, etc.

Figure 9:
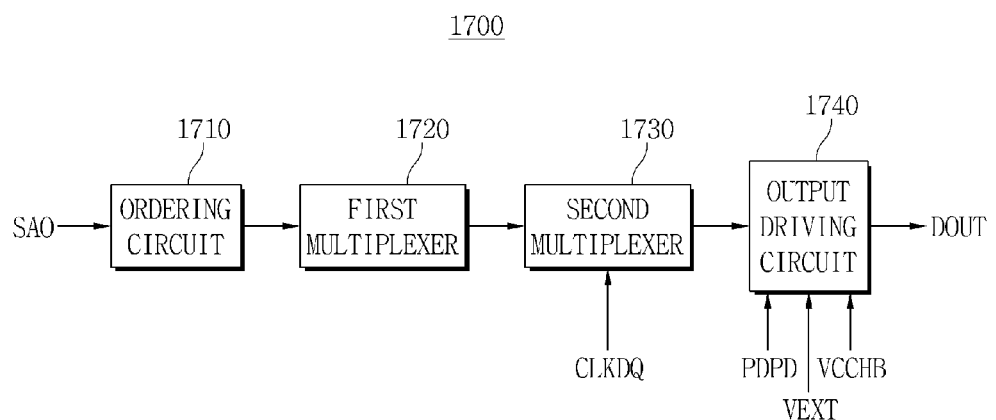
FIG. 9 is a block diagram illustrating the output circuit included in the semiconductor memory device of FIG. 8 in accordance with exemplary embodiments.

FIG. 9 is a block diagram illustrating the output circuit 1700 included in the semiconductor memory device 1000 of FIG. 8 in accordance with exemplary embodiments.

Referring to FIG. 9, the output circuit 1700 may include an ordering circuit 1710, a first multiplexer 1720, a second multiplexer 1730 and an output driving circuit 1740.

The ordering circuit 1710 determines the output order of the first data SAO. The first multiplexer 1720 selects an output bit structure and outputs second data in response to an output signal of the ordering circuit 1710. The second multiplexer 1730 performs a parallel-serial conversion to generate third data in response to an output clock signal CLKDQ. The output driving circuit 1740 performs power mixing on the third data to generate output data DOUT.

The semiconductor memory device 1000 of FIG. 8 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 10:
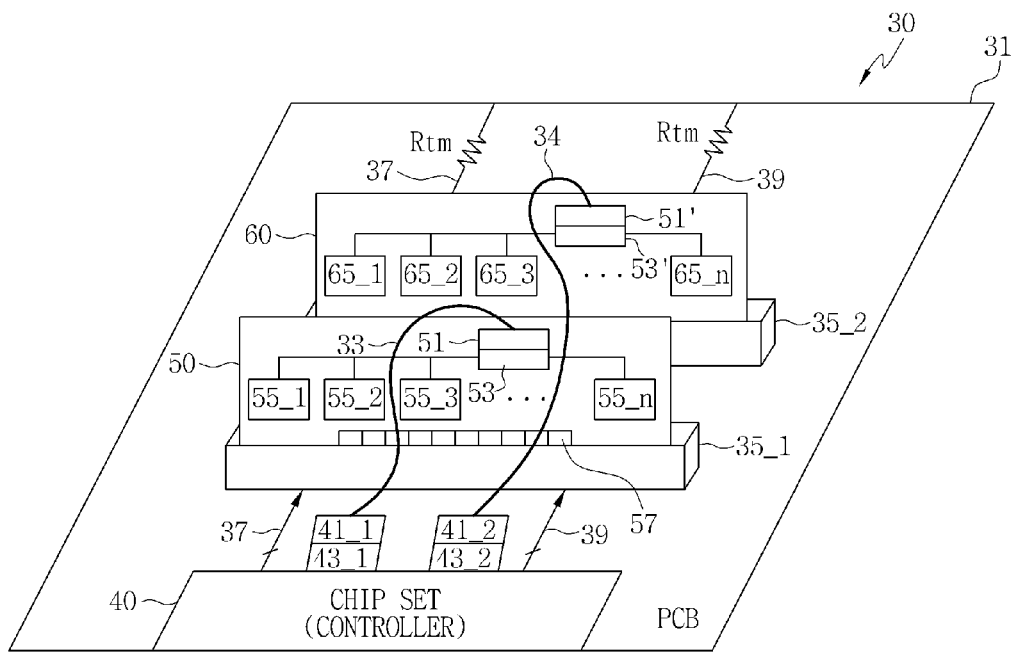
FIG. 10 is a diagram of an example of a memory system including a semiconductor memory device in accordance with embodiments.

FIG. 10 is a diagram of an example of a memory system 30 including a semiconductor memory device in accordance with embodiments.

Referring to FIG. 10, the memory system 30 may include a motherboard 31, a chip set (or a controller) 40, slots 35_1 and 35_2, memory modules 50 and 60, and transmission lines 33 and 34. Buses 37 and 39 connect the chip set 40 with the slots 35_1 and 35_2. A terminal resistor Rtm may terminate each of the buses 37 and 39 on a PCB of the motherboard 31.

For convenience, in FIG. 10, only two slots 35_1 and 35_2 and two memory modules 50 and 60 are shown. However, the memory system 30 may include an arbitrary number of slots and memory modules.

The chip set 40 may be mounted on the PCB of the motherboard 31, and control the operation of the memory system 30. The chip set 40 may include connectors 41_1 and 41_2 and converters 43_1 and 43_2.

The converter 43_1 receives parallel data generated by the chip set 40, converts the parallel data to serial data, and outputs the serial data to the transmission line 33 via the connector 41_1. The converter 43_1 receives serial data via the transmission line 33, and converts the serial data to parallel data and outputs the parallel data to the chip set 40.

The converter 43_2 receives parallel data generated by the chip set 40, converts the parallel data to serial data, and outputs the serial data to the transmission line 34 via the connector 41_2. The converter 43_2 receives serial data via the transmission line 34, and converts the serial data to parallel data and outputs the parallel data to the chip set 40. The transmission lines 33 and 34 included in the memory system 30 may be, for example, a plurality of optical fibers.

The memory module 50 may include a plurality of memory devices 55_1 to 55_n, a first connector 57, a second connector 51, and a converter 53. The memory module 60 may include a plurality of memory devices 65_1 to 65_n, a first connector 57', a second connector 51', and a converter 53'.

The first connector 57 may transfer low-speed signals received from the chip set 40 to the memory devices 55_1 to 55_n, and the second connector 51 may be connected to the transmission line 33 for transferring high-speed signals.

The converter 53 receives serial data via the second connector 51, converts the serial data to parallel data, and outputs the parallel data to the memory devices 55_1 to 55_n. Further, the converter 53 receives parallel data from the memory devices 55_1 to 55_n, converts the parallel data to serial data, and outputs the serial data to the second connector 51.

The memory devices 55_1 to 55_n and 65_1 to 65_n may include a semiconductor memory device according to embodiments of the disclosure. Therefore, the memory devices 55_1 to 55_n and 65_1 to 65_n may include an output circuit according to embodiments of the disclosure. The output circuit included in the memory devices 55_1 to 55_n and 65_1 to 65_n may have a power mixing function, and enable the power mixing control signal CON_PM based on the power-up signal VCCHB and the deep-power-down mode signal PDPD, and stabilize an output voltage regardless of the change of level of an internal supply voltage.

The memory devices 55_1 to 55_n and 65_1 to 65_n may be a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 11:
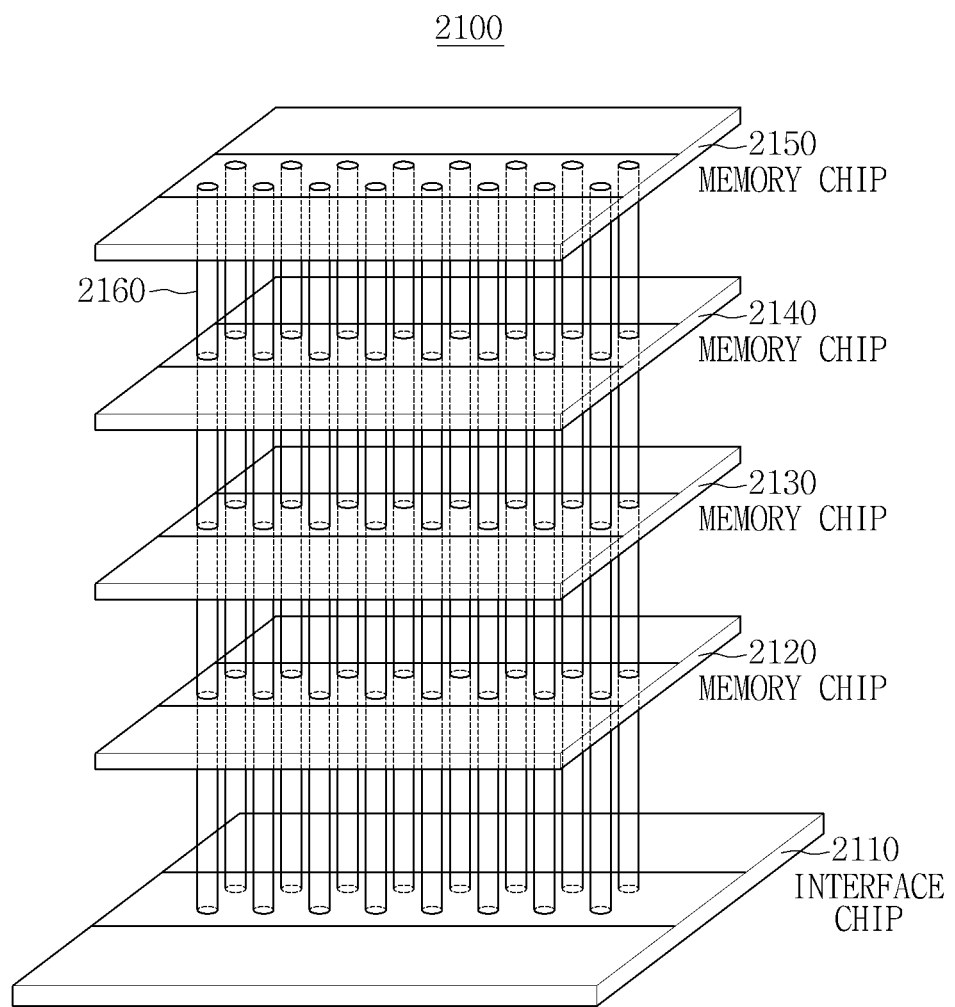
FIG. 11 is a diagram of an example of a stacked semiconductor device including a semiconductor memory device in accordance with embodiments.

FIG. 11 is a diagram of an example of a stacked semiconductor device 2100 including a semiconductor memory device 100 according to embodiments.

Referring to FIG. 11, the stacked semiconductor device 2100 may include an interface chip 2110, and memory chips 2120, 2130, 2140 and 2150 which are electrically connected through through-silicon vias 2160. Although the through-silicon vias 2160 disposed in two rows are shown in FIG. 11, the stack semiconductor device 2100 may include any number of through-silicon vias.

The memory chips 2120, 2130, 2140 and 2150 included in the stacked semiconductor device 2100 may include the refresh circuit in accordance with the embodiments as described above. The interface chip 2110 performs as an interface between the memory chips 2120, 2130, 2140 and 2150 and external devices.

Figure 12:
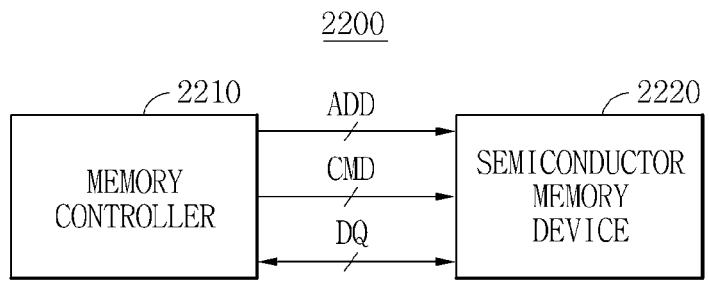
FIG. 12 is a block diagram of another example of a memory system including a semiconductor memory device in accordance with embodiments.

FIG. 12 is a block diagram of another example of a memory system 2200 including a semiconductor memory device in accordance with embodiments.

Referring to FIG. 12, the memory system 2200 includes a memory controller 2210 and a semiconductor memory device 2220.

The memory controller 2210 generates address signals ADD and command signals CMD, and provides the address signals ADD and the command signals CMD to the semiconductor memory device 2220 through buses. Data DQ may be transmitted from the memory controller 2210 to the semiconductor memory device 2220 through the buses, or transmitted from the stacked semiconductor memory device 2220 to the memory controller 2210 through the buses.

The semiconductor memory device 2220 may include an output circuit having a power mixing function. The semiconductor memory device 2220 may stabilize an output voltage regardless of a change of an internal supply voltage.

Figure 13:
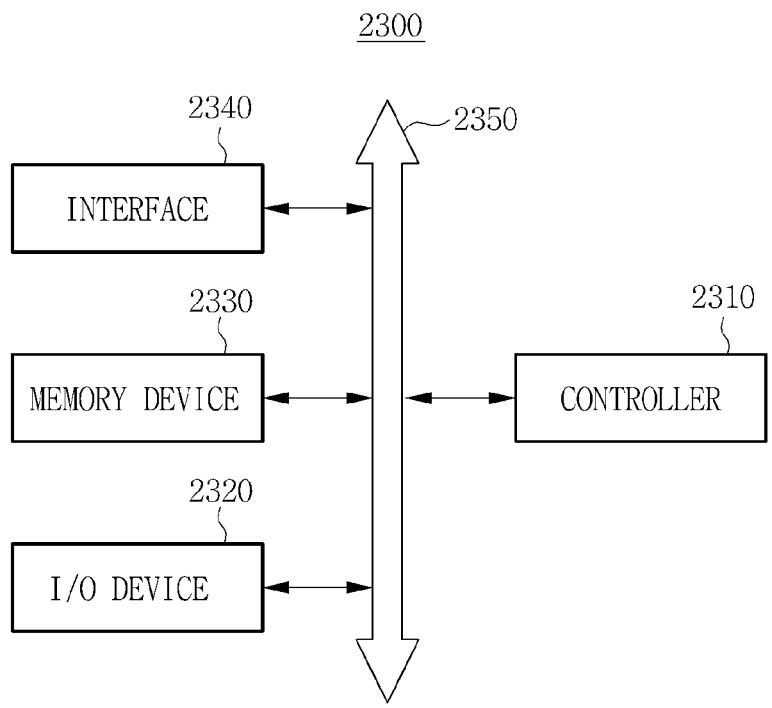
FIG. 13 is a block diagram of an example of an electronic system including a semiconductor memory device in accordance with embodiments.

FIG. 13 is a block diagram of an example of an electronic system 2300 in which a semiconductor memory device in accordance with embodiments.

Referring to FIG. 13, the electronic system 2300 in accordance with embodiment may include a controller 2310, an input and output device 2320, a memory device 2330, an interface 2340, and a bus 2350. The memory device 2330 may be a semiconductor memory device including the refresh circuit in accordance with embodiments of the inventive concept. The bus 2350 may function to provide a path in which data is mutually moved among the controller 2310, the input and output device 2320, the memory device 2330, and the interface 2340.

The controller 2310 may include any one of logic devices that can perform functions of at least one of a microprocessor, a digital signal processer, and a microcontroller, or functions similar to those. The input and output device 2320 may include at least one selected from a key pad, key board, and a display device. The memory device 330 may function to store data and/or instructions performed by the controller 2310.

The memory device 2330 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof. The memory device 2330 may be the semiconductor memory device including the refresh circuit in accordance with embodiments.

The interface 2340 may function to transmit/receive data to/from a communication network. The interface 2340 can include an antenna, wired or wireless transceivers or the like, to transmit and receive data by wires or wirelessly. In addition, the interface 2340 can include optical fibers to transmit and receive data through the optical fibers. The electronic system 2300 may be further provided with an application chipset, a camera image processor, and an input and output device.

The electronic system 2300 may be implemented as a mobile system, personal computer, an industrial computer, or a logic system that can perform various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 2300 is an apparatus that can perform wireless communication, the electronic system 2300 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A power mixing circuit, comprising:
    an input buffer configured to operate using a first supply voltage having a first voltage level, and to generate a first voltage signal in response to an input signal;
    a power mixing control circuit configured to generate a power mixing control signal based on a power-up signal and a power-down mode signal, the power-up signal generated when an external supply voltage rises up, and the power-down mode signal generated when a semiconductor device operates in a first mode;
    a power mixing driver configured to operate using the external supply voltage and a second supply voltage having a second voltage level, to perform power mixing on the external supply voltage and the second supply voltage, and to generate a second voltage signal in response to the first voltage signal and the power mixing control signal; and
    an output buffer configured to operate using the second supply voltage, and to generate an output signal in response to the second voltage signal.

2. The power mixing circuit according to claim 1, wherein the power mixing circuit is configured to output the output signal having a fixed logic high level or logic low level regardless of the first voltage level in the first mode, the first mode being a deep-power-down mode.

3. The power mixing circuit according to claim 2, wherein the first voltage level is a ground voltage level in the deep-power-down mode.

4. The power mixing circuit according to claim 1, wherein the power mixing circuit is configured to output the output signal having a fixed logic high level or logic low level regardless of the first voltage level in the first mode, the first mode being a power-down mode.

5. The power mixing circuit according to claim 1, wherein the power mixing control circuit is configured to operate using the external supply voltage.

6. The power mixing circuit according to claim 1, wherein the input buffer is configured to invert a phase of the input signal to generate the first voltage signal, and
    wherein the output buffer is configured to invert a phase of the second voltage signal to generate the output signal.

7. The power mixing circuit according to claim 1, wherein the power mixing driver comprises:
    a first NOR circuit configured to operate using the external supply voltage, and configured to perform a logical NOR operation on the power mixing control signal and the first voltage signal;
    a first inverter configured to operate using the second supply voltage, and configured to invert a phase of an output signal of the first NOR circuit;
    a second NOR circuit configured to operate using the second supply voltage, and configured to perform a logical NOR operation on the power mixing control signal and the first voltage signal; and
    a second inverter configured to operate using the second supply voltage, and configured to invert a phase of an output signal of the second NOR circuit.

8. The power mixing circuit according to claim 1, wherein the power mixing control circuit comprises:
    a first NOR circuit configured to perform a logical NOR operation on the power-up signal and the power-down mode signal;
    a first inverter configured to invert a phase of an output signal of the first NOR circuit;
    a first PMOS transistor configured to have a gate connected to an output terminal of the NOR circuit, and a source connected to the external supply voltage;
    a first NMOS transistor configured to have a gate connected to an output terminal of the first inverter, and a source connected to a ground;
    a first latch circuit configured to latch a voltage of a drain of the first PMOS transistor and a voltage of a drain of the first NMOS transistor;
    a second inverter configured to invert a phase of a voltage of the drain of the first PMOS transistor;
    a second NOR circuit configured to perform a logical NOR operation on an output signal of the second inverter and the output signal of the first NOR circuit;
    a second PMOS transistor configured to have a gate connected to an output terminal of the second NOR circuit, and a source connected to the external supply voltage;
    a second NMOS transistor configured to have a drain connected to a drain of the second PMOS transistor, a gate connected to the output terminal of the first inverter, and a source connected to the ground;
    a second latch circuit configured to latch a voltage of a drain of the second PMOS transistor and a drain of the second NMOS transistor; and
    an OR circuit configured to perform a logical OR operation on an output signal of the second latch circuit and the output signal of the second inverter to generate the power mixing control signal.

9. The power mixing circuit according to claim 8, wherein the first latch circuit comprises:
    a first latch unit connected to the external supply voltage and configured to include two PMOS transistors cross-coupled to each other;
    a second latch unit configured to connect to a drain of the first PMOS transistor and a drain of the first NMOS transistor, and configured to include two NMOS transistors cross-coupled to each other; and
    a current supplying unit configured to form current path between the drain of the first PMOS transistor and the ground, or between the drain of the first NMOS transistor and the ground.

10. The power mixing circuit according to claim 1, wherein the power mixing driver comprises:
    a first NAND circuit configured to operate using the external supply voltage, and configured to perform a logical NAND operation on the power mixing control signal and the first voltage signal;
    a first inverter configured to operate using the second supply voltage, and configured to invert a phase of an output signal of the first NAND circuit;
    a second NAND circuit configured to operate using the second supply voltage, and configured to perform a logical NAND operation on the power mixing control signal and the first voltage signal; and
a second inverter configured to operate using the second supply voltage, and configured to invert a phase of an output signal of the second NAND circuit.

11. The power mixing circuit according to claim 10, wherein the power mixing control signal is configured to have a logic low state in the first mode, the first mode being a deep-power-down mode.

12. A semiconductor memory device comprising:
an external supply voltage applied to the semiconductor device;
an internal supply voltage generated based on the external supply voltage;
a memory cell array configured to operate in response to a word line enable signal and a column selecting signal;
an address input buffer configured to generate a row address signal and a column address signal based on an external address;
a row decoder configured to decode the row address signal to generate the word line enable signal;
a column decoder configured to decode the column address signal to generate the column selecting signal;
an input/output (I/O) sense amplifier configured to amplify data output from the memory cell array to generate first data, and transfer data received at a terminal of the semiconductor memory device to the memory cell array;
a power-up signal generating circuit configured to generate a power-up signal based on the external supply voltage; and
an output circuit configured to perform power mixing on the first data in response to a deep-power-down mode signal, the power-up signal, the internal supply voltage, and the external supply voltage to generate output data,
wherein the semiconductor memory device is configured to generate a power mixing control signal in response to the deep-power-down mode signal and the power-up signal in a deep-power-down mode, and to generate the output data having a fixed low logic level or a high logic level in response to the power mixing control signal regardless of a level of the internal supply voltage.

13. The semiconductor memory device according to claim 12, wherein the output circuit comprises:
an ordering circuit configured to determine the output order of the first data;
a first multiplexer configured to select an output bit structure and output second data in response to an output signal of the ordering circuit;
a second multiplexer configured to perform a parallel-serial conversion to generate third data; and
an output driving circuit configured to perform power mixing on the third data to generate the output data.

14. The semiconductor memory device according to claim 13, wherein the output driving circuit comprises:
an input buffer configured to operate using a first supply voltage having a first voltage level, and to generate fourth data based on the third data;
a power mixing control circuit configured to generate a power mixing control signal based on the power-up signal and the deep-power-down mode signal;
a power mixing driver configured to operate using the external supply voltage and a second supply voltage having a second voltage level, to perform power mixing on the fourth data in response to the power mixing control signal, and to generate fifth data in response to the power mixing control signal and the fourth data; and
an output buffer configured to operate using the second supply voltage, and to generate the output data in response to the fifth data.

15. The semiconductor memory device according to claim 12, wherein the semiconductor memory device is a stacked memory device in which a plurality of chips communicates data and control signals by a through-silicon-via (TSV).

16. A semiconductor device comprising:
a terminal for receiving an external supply voltage applied to the semiconductor device;
an internal voltage generation circuit configured to generate a first supply voltage based on the external supply voltage;
an input circuit configured to receive the first supply voltage and an input signal;
a power mixing control circuit configured to receive the external supply voltage and configured to generate a power mixing control signal in response to a power-up signal and a deep-power-down mode signal, the power-up signal generated when the external power supply voltage rises up and the deep-power-down mode signal generated when the semiconductor device operates in a deep-power-down mode;
a power mixing driver configured to receive the external power supply voltage and a second supply voltage and configured to generate a power mixing driver output signal in response to the power mixing control signal and an output signal of the input circuit; and
an output circuit configured to output a power mixing circuit output signal in response to the power mixing driver output signal,
wherein the power mixing circuit output signal has a logic low level or a logic high level regardless of a level of the first supply voltage when the semiconductor device operates in the deep-power-down mode.

17. The semiconductor device according to claim 16, wherein the power mixing control circuit is configured to change a level of the power mixing control signal to a logic low level or a logic high level when the semiconductor device enters the deep-power-down mode.

18. The semiconductor device according to claim 17, wherein the power mixing control circuit is configured to latch a level of the power mixing control signal to a logic low level or a logic high level.

19. The semiconductor device according to claim 16, wherein a level of the second supply voltage is equal to or less than a level of the external supply voltage.

20. The semiconductor device according to claim 16, wherein a level of the first supply voltage is a ground voltage level in the deep-power-down mode.

* * * * *